United States Patent [19]

Ikeda et al.

[11] Patent Number: 5,011,545

[45] Date of Patent: Apr. 30, 1991

[54] METHOD OF MANUFACTURING HARD-TO-WORK ALLOY ARTICLES SUCH AS OF INTERMETALLICS AND SUPERCONDUCTING COMPOUNDS

[75] Inventors: Senri Ikeda, 7-54 Miyamachi 3-chome; Sakae Saito, 5-5-304 Tsurugaya 2-chome, both of Sendai-shi, Miyagi-ken; Shuji Hanada, Sendai; Hironobu Hoshi, Tokyo, all of Japan

[73] Assignees: Nippon Stainless Steel Co., Ltd., Tokyo; Senri Ikeda; Sakae Saito, both of Sendai, all of Japan

[21] Appl. No.: 408,364

[22] Filed: Sep. 18, 1989

[30] Foreign Application Priority Data

Sep. 19, 1988 [JP] Japan .................. 63-234256

[51] Int. Cl.$^5$ .................... H01L 39/24; C22B 7/00
[52] U.S. Cl. .................... 148/11.5 F; 29/599; 148/11.5 Q; 148/133; 428/930
[58] Field of Search .............. 148/11.5 F, 11.5 Q, 148/133; 29/599; 428/930

[56] References Cited

U.S. PATENT DOCUMENTS

| | | | |
|---|---|---|---|
| 2,891,286 | 6/1959 | Oswandel | 18/59.3 |
| 4,110,892 | 9/1978 | Bangay et al. | 29/420 |
| 4,215,465 | 8/1980 | Dew-Hughes | 148/11.5 F |
| 4,224,735 | 9/1980 | Young et al. | 148/11.5 Q |
| 4,242,419 | 12/1980 | Dayem et al. | 29/599 |
| 4,447,946 | 3/1984 | Marancik | 148/11.5 F |
| 4,508,578 | 4/1985 | Wada et al. | 148/11.5 F |
| 4,640,816 | 2/1987 | Atzmon et al. | 29/599 |
| 4,811,766 | 3/1989 | Sastry et al. | 148/11.5 Q |
| 4,830,262 | 5/1989 | Ishibe | 148/11.5 Q |

FOREIGN PATENT DOCUMENTS

| | | |
|---|---|---|
| 62875 | 5/1975 | Australia . |
| 887345 | 2/1981 | Belgium . |
| 2502408 | 6/1976 | Fed. Rep. of Germany . |
| 2725328 | 7/1978 | Fed. Rep. of Germany . |
| 2118207 | 10/1983 | United Kingdom . |

OTHER PUBLICATIONS

Reich, IBM-Tech. Disc. Bull. 5 (Dec. 1962) p. 5.
Patent Abstracts of Japan, vol. 10, No. 311 (M-528) [2367], Oct. 23, 1986; and JP-A-61-123,487 dated Jun. 11, 1986.
Patent Abstracts of Japan, vol. 7, No. 207 (M-242) [1352], Sep. 13, 1983; and JP-A-58-103,985, dated Jun. 21, 1983.
Patent Abstracts of Japan, vol. 6, No. 236 (M-173) [1114], Sep. 25, 1982; and JP-A-57-134,283 dated Aug. 19, 1982.
"Scrap Aluminum Process Yields Low Cost, High Quality Parts", *Product Engineering*, vol. 49, No. 8, Aug. 1978, pp. 16, 18.
"A New PM Process", *Machine Design*, vol. 50, No. 13, Aug. 10, 1978, pp. 34–35.
"Powder Metallurgy", *Metals Handbook*, 9th Edition, vol. 7, 1984, pp. 636–638.
Dew-Hughes, "Critical Currents at High Fields in $Nb_3Al$ Multifilamentary Wires", IEEE Transactions on Magnetics, vol. MAG-17, No. 1, Jan. 1981, pp. 561–564.
Saito et al, "Fabrication of $Nb_3Al$-Wires by the Infiltration Process and their Superconductive Performance", J. Japan Institute Metals, vol. 53, No. 3, (1989), pp. 333–338.
Inoue et al, "Superconducting Properties of $Nb_3Al$ Multifilamentary Wire", Appl. Phys. Lett. 52(20), May 16, 1988, pp. 1724–1725.
Watanabe et al. "Superconducting Properties of Powder Metallurgy Processed $Nb_3Al$ Wires", IEEE Transactions on Magnetics, vol. MAG-23, No. 2, Mar. 1987, pp. 1428–1431.

*Primary Examiner*—Upendra Roy
*Attorney, Agent, or Firm*—Burns, Doane, Swecker & Mathis

[57] ABSTRACT

A method for manufacturing a hard-to-work alloy article comprises the steps of: preparing a laminate member comprising a plurality of layers of different metals in a stoichiometric ratio for the intended alloy composition; dividing the laminate member into pieces; combining the pieces to a body for plastic deformation; subjecting the body to plastic deformation under pressure to form an article having a given shape and dimensions; and applying a thermal diffusion treatment to the article.

29 Claims, 13 Drawing Sheets

(a)

X 3.2

(b)

X 3.2

Fig. 3
(a)
DEGREE OF WORKING: $8.9 \times 10^4$
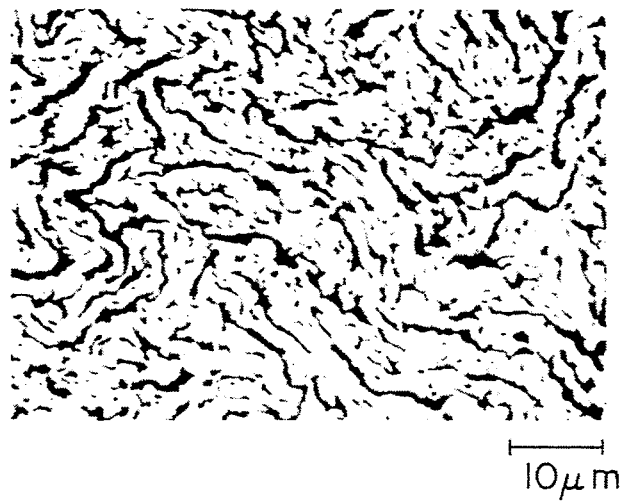
(b)
DEGREE OF WORKING: $2.7 \times 10^5$
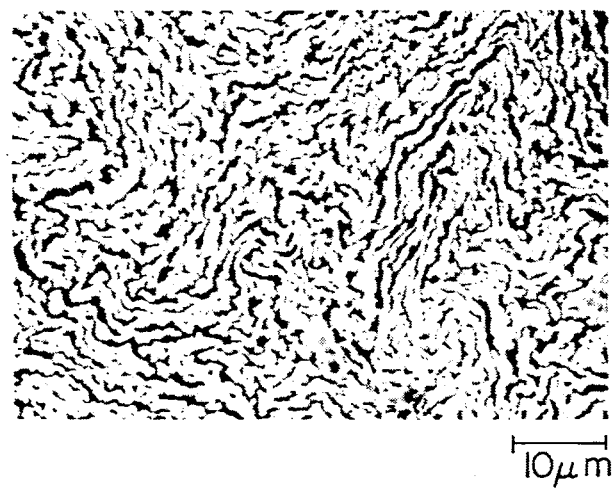
(c)
DEGREE OF WORKING: $2.4 \times 10^6$
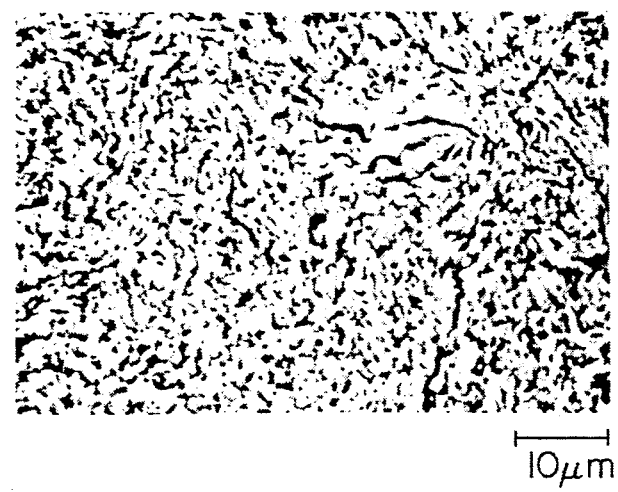

(a)

5mm (b)

5mm (a)

DEGREE OF
WORKING: 56

(b)

DEGREE OF
WORKING: 3164

METHOD OF MANUFACTURING HARD-TO-WORK ALLOY ARTICLES SUCH AS OF INTERMETALLICS AND SUPERCONDUCTING COMPOUNDS

BACKGROUND OF THE INVENTION

The present invention relates to a method of manufacturing hard-to-work alloy articles. In particular, it relates to a method of working hard-to-work alloys, such as intermetallic compounds, to fabricate articles having stable qualities on an industrial scale.

Intermetallic compounds have a general tendency that their metallic nature is lost to some extent with a degradation in workability and it is extremely difficult to form them into desired shapes.

Recently, a large number of new types of materials, such as superconducting materials and shape-memory alloys, have been discovered, some of which are made of intermetallic compounds. Thus, there is a need for a method which can form intermetallic compounds into desired shapes.

Among superconducting materials, $Nb_3Sn$, $V_3Ga$, $Nb_3(Al_{0.8}Ge_{0.2})$, $Nb_3Ge$, $Nb_3Al$ are known to have the high values of critical magnetic field, critical current density, and critical temperature. Alloys such as Ni-Ti, Ag-Cd, Cu-Al-Ni, Cu-Au-Zn, Cu-Sn, Cu-Zn, Cu-Zn-X (X=Si, Sn, Al), Cu-Zn-Y (Y=Ca, Al), Ni-Al, In-Tl, Fe-Pt, Fe-Pd, and Mn-Cu alloys are also known to have the ability to remember an initial shape and to return to that shape; i.e. they are called shape memory alloys. Intermetallic compounds, such as $Zr_3Al$, are used for making sheathes for fuel pellets in light-water reactors. Intermetallic compounds such as $Ni_3Al$, $TiAl$, $Co_3Ti$, $Ti_3Al$, $Mo_3Si$, and $Ni_2AlTi$ are also useful as heat-resistant structural materials. FeTi and $LaNi_5$ are useful as hydrogen storage alloys, and FeCo and $Fe_3Al$ are employed as magnetic materials.

As already mentioned, none of these materials is easy to work, and it is quite difficult to form them into a fine wire, for example. In fact, in some cases it is impossible to perform mechanical working on such materials.

Thus, in the past the following processes have been employed in order to manufacture elongated products such as plate, rod, and wire.

In the case of intermetallic compounds such as TiNi and $Ni_3Al$, it is difficult to carry out the plastic deformation of these materials. However, as they are plastically deformable to some extent, the same manufacturing processes as for conventional metallic materials have been applied. First, a melt of the material is prepared and is poured into a mold to form castings. Then, repeated steps of annealing and plastic deformation are performed to form articles in the shape of plate, rod, wire and the like.

However, these manufacturing processes are expensive. Furthermore, there is an inevitable fluctuation in alloy composition caused by yielding of the alloying elements in preparing them into a melt, and also segregation of alloying elements which takes place during solidification after casting, resulting in a degradation in the properties of the material.

On the other hand, in the case of intermetallic compounds such as $Nb_3Al$ which are hard to work and are not plastically deformable, the following processes have been proposed to form a wire, such as a $Nb_3Al$ wire.

(a) As shown in FIG. 10, a mixture of Nb powder and Al powder is subjected to extrusion to form a billet, which is then further processed by drawing, for example, to make a fine wire. The resulting wire is then subjected to a thermal diffusion treatment to form a wire comprising $Nb_3Al$. This is called the powder metallurgy process.

(b) As shown in FIG. 11, powdery Nb is subjected to isostatic pressure to form a compact which is then sintered. The sintered body is immersed in an Al molten bath in which molten aluminum penetrates into the body to prepare a composite body, which is then extruded and rolled with a grooved roll or drawn to form a wire. The wire is subjected to a thermal diffusion treatment to form a wire comprising $Nb_3$ Al. This process is called the infiltration method.

(c) As shown in FIG. 12, a Nb plate and an Al plate are laminated in a stoichiometrical ratio necessary to form them into an intermetallic compound. The laminated plate is then tightly wound in the form of a billet, which is subjected to drawing and a thermal diffusion treatment so as to obtain a $Nb_3Al$ wire. This process is called the jelly-roll method.

(d) As shown in FIG. 13, an Al rod is inserted into a Nb tube to fabricate a tubular assembly, which is then extruded and drawn to form a wire. The resulting wire is subjected to a thermal diffusion treatment to form a $Nb_3Al$ wire. This process is called the "Tube Process".

These methods have the following drawbacks:

(I) In the methods described in sections (a) and (b), since it is necessary to handle metal powders, and especially very active metal powders, the following disadvantages are inevitable.

(i) There is a tendency for the powder to absorb gas from the atmosphere, particularly oxygen. This absorption increases the content of impurities, resulting in a degradation of formability. Nb can easily absorb oxygen gas, and due to an increase in the oxygen content, plastic deformability and superconductive properties are markedly degraded.

(ii) When combining powders, local concentrations occur and it is difficult to obtain a uniform mixture of powders, resulting in a marked fluctuation in the alloy composition.

(iii) Since very active powders are handled, it is necessary to be extremely careful to avoid explosions.

(iv) Nb powder is harmful when it enters the human body.

In particular, although it is necessary to make the starting powders as fine as possible so as to obtain a uniform mixture of the powders, the fineness of the powder imposes limitations on the dimensions of the shaped article since the finer the powder the greater the surface oxidation.

(II) When above-described method (c) is used, the winding is apt to be carried out loosely at the core of the roll. Furthermore, when the material is subjected to drawing, the metal flow in the central area differs from that in peripheral areas (metal flow in the central area lags behind that in the periphery). Therefore, when the resulting assembly is shaped into wires, the central portion of the cross section does not have such a fine structure that is necessary to obtain the intended $Nb_3Al$ composition after a thermal diffusion treatment is performed. When above-described method (d) is used, an extremely high reduction is required to obtain the fine Nb-Al structure which is necessary to get $Nb_3Al$ by diffusion reaction.

Thus, the prior art methods for producing shaped articles of hard-to-work metals, such as intermetallic compounds, are costly and not adequately reliable. Moreover, such articles have some limits with respect to the uniformity of their alloy composition as well as dimensions, so that it is quite difficult to produce them on an industrial scale.

SUMMARY OF THE INVENTION

The object of the present invention is to provide an efficient and industrial method for producing shaped articles having a uniform alloy composition from hard-to-work alloys, and particularly, shaped articles made of intermetallic compounds. Such articles will be referred to as "hard-to-work alloy articles".

A method for manufacturing a hard-to-work alloy article according to the present invention comprises the steps of:

preparing a laminate comprising a plurality of layers of different metals in a stoichiometric ratio for the intended alloy composition;

dividing the laminate into pieces;

combining the pieces to a body for plastic deformation;

plastically deforming the body under pressure to form an article having a given shape and dimensions; and applying a thermal diffusion treatment to the article.

The plastic deformation may be carried out, for example, by means of extruding, rolling, drawing or a combination thereof.

BRIEF DESCRIPTION OF THE DRAWINGS

FIGS. 3(a), (b), and (c) are photographs showing the microstructure of dense rods subjected to different degrees of working and obtained by cold extrusion, rolling with grooved rolls, and drawing in a working example of the present invention;

DESCRIPTION OF THE PREFERRED EMBODIMENTS

The present invention will now be described in conjunction with the accompanying drawings.

Figure 1:
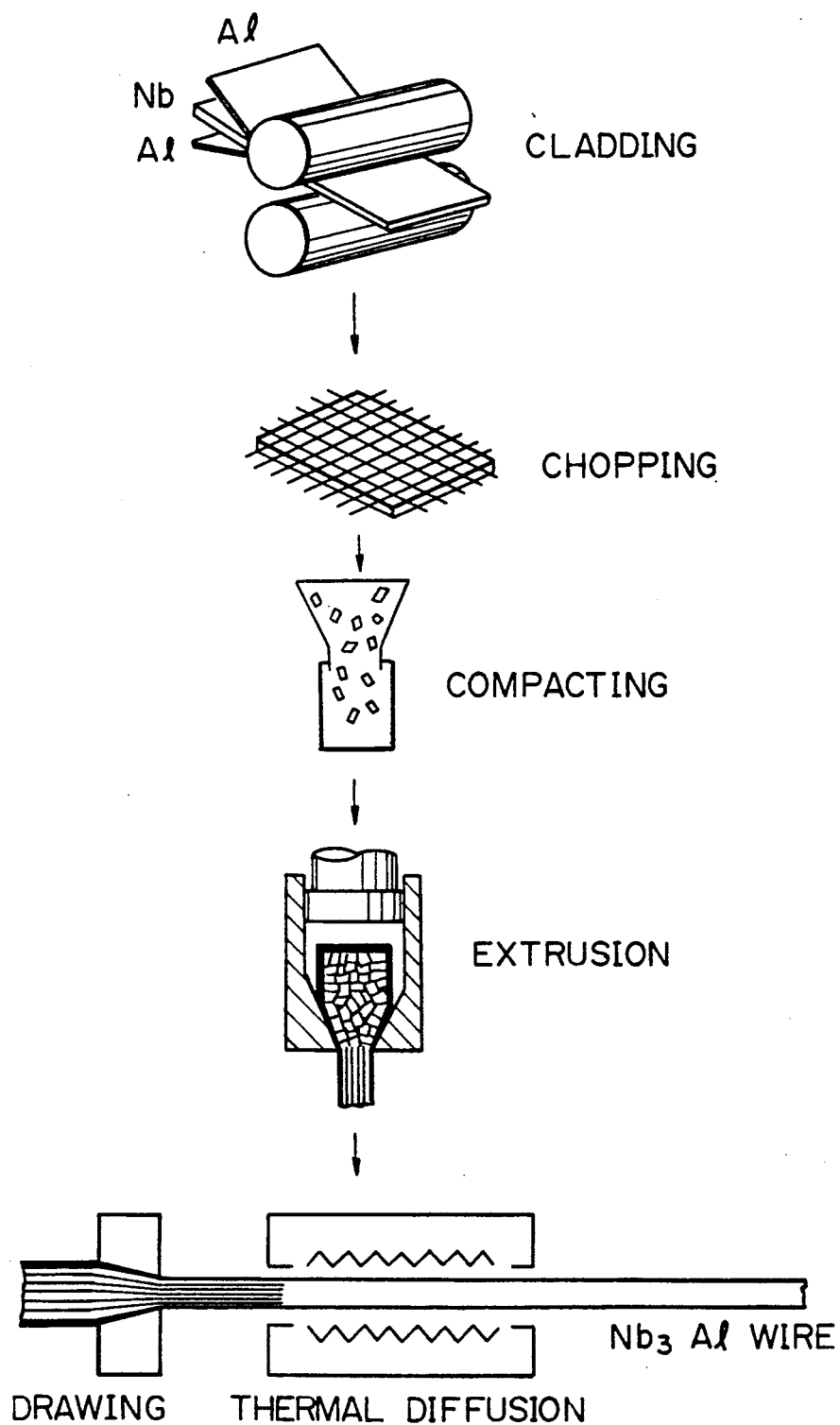
FIG. 1 is a schematic illustration of the process of manufacturing a hard-to-work material article in accordance with the present invention.

FIG. 1 schematically illustrates a process for manufacturing a hard-to-work metal article which at least partly comprises intermetallic compounds in accordance with the present invention. According to the illustrated process, metal components which constitute an intended alloy or an intermetallic compound (hereunder referred to as constituent metals) are first assembled or laminated in the form of a plate to fabricate a blank which has a shape which is easy to work and which contains each of the components in a suitable ratio, e.g., in a stoichiometrical ratio in the case of intermetallic compounds. The total thickness of the assembled blank is preferably 0.01–5 mm. The thinner the blank the less degree of working is required. When the assembly is composed of easy-to-work metals or pure metals, and not of intermetallic compounds or hard-to-work metals, i.e., of metals in which thermal diffusion has not yet taken place, the blank is deformable and can easily be worked even with a high working ratio.

FIG. 1 shows a process which employs a roll-clad method for assembling a blank. Other methods, such as plating, vapor-depositing, up-setting, explosive, molten metal spraying, cementating and ion-plating methods may also be employed for this purpose. The laminated blank need not be in the shape of a plate, and any other shapes such as rod and bar may be employed. Furthermore, in laminating the constituting metal members, an active metal member is preferably placed in an inner position as a core to form a sandwich-like laminate.

The thus-prepared laminate blank is then chopped or clipped into pieces. The blank may be stamped to give disc-shaped pieces. The chopped pieces may be rectangular as shown in FIG. 1, circular, elliptical, triangular, polygonal, star-shaped, or of any other desired shape. The maximum dimension (diameter, side, or diagonal of the pieces is preferably of 1–50 mm. The dimensions of the pieces can be selected in accordance with the capacity of a pressing machine, for example, which is used in a subsequent step to compact the pieces to form an article. That is, the size of the pieces is selected so that the pieces can be packed closely enough upon working for the constituent metals to diffuse into each other when the resulting compact body is subjected to thermal diffusion.

The thus-prepared pieces are combined in a random arrangement and formed into a desired shape by extrusion, rolling, and other methods. When the working ratio is suitably selected, the resulting extruded or rolled article has an intended composition throughout with respect to constituent metals and is substantially free of segregation.

In accordance with one embodiment of the present invention it is preferable to apply extrusion, since during extrusion the chopped pieces are further strongly combined with each other due to additional shearing deformation and are oriented in the direction of extrusion.

A worked article has a fine and uniform structure. Before being subjected to thermal diffusion, none of the constituent metals is reacted, so the compact body can easily be subjected to further working.

It is desirable that the pieces are first packed into a sheath, such as hollow tube. The packed sheath can be charged into a container for extrusion and then extruded into a rod or plate. The combined pieces may also be charged into the container directly and then extruded.

The specific material (a metal or alloy, for example) for making the sheath can be selected on the basis of whether it has a deformation resistance on the same level as the chopped pieces, and whether it has chemical properties different from those of the chopped pieces, since it must be easily removable, upon need, by a chemical process (corrosion, evaporation, etc.).

Furthermore, if necessary, the resulting dense bodies can be collected and then deformed into an article having a desired shape and dimensions. Since the collected bodies have not yet been subjected to thermal diffusion, and since each dense body is in mixture with others, it is rather easy to carry out plastic working on the collected bodies.

The deformed dense article having a final shape and dimensions is then subjected to thermal diffusion as a final stage of processing. When heat treatment is applied, each of the constituent metals diffuses to make the alloy composition of the body uniform, resulting in formation of intermetallic compounds (alloys) in a desired proportion.

Conditions under which the thermal diffusion is carried out are not restricted to specific ones so far as an intermetallic compound is formed. The thermal diffusion treatment may be carried out in two stages, first at a high temperature for a short time and second at a low temperature for a long time.

Thus, according to the present invention, an article having a desired shape and dimensions which is at least partly made of hard-to-work alloys can be easily and efficiently manufactured.

Some of the advantages of the present invention are as follows.

(1) There is no segregation, which usually occurs in conventional processes including melting and casting.

(2) Not so many times of annealing treatment as in conventional processes are required while plastic deformation is being performed.

(3) There is no substantial deviation of the alloy composition from the intended composition which occurs in a conventional process due to yielding of alloying elements during melting.

(4) There is no contamination by gases such as oxygen, which sometimes occurs when metallic powder is used as a starting material. Such contamination with gas results in a change in alloy composition and degradation in workability.

(5) A uniform composition is attainable. When a mixing step for metallic powder is employed, a local concentration of some constituent is inevitable, resulting in the alloy having a non-uniform composition.

(6) There is no need for powdery materials, which must be handled with care to avoid explosions and inhalation of the powders by humans.

(7) The processing steps are very simple, and manufacturing costs can be reduced markedly.

(8) A composite article can be manufactured when the sheath is made of a different metal from the constituent metals of the body and remains on the body after working.

(9) An elongated article having a variety of deformed sections can be manufactured by extrusion using appropriate dies.

(10) Since the chopped pieces, which are used as starting material, may have a desired alloy composition, fine wires and foils can be formed by deformation under pressure such as extrusion by placing separating or releasing members between each of the assembled bodies.

(11) Chopped or clipped pieces can be pre-assembled, and continuous production of lengthy articles can be performed.

(12) It is possible to produce $Nb_3Al$ fine wire and $Nb_3(Al,Ge)$ fine wire efficiently on an industrial scale. The method of the present invention can obtain a superconducting wire having a critical current density with respect to external magnetic fields which is much higher than that obtained through a powder metallurgy process.

The present invention will next be described in further detail in conjunction with a number of working examples.

EXAMPLES

Example 1

In this example, $Nb_3Al$ wire was produced.

As shown in FIG. 1, a Nb plate having a thickness of 1.015 mm was sandwiched between two Al plates each measuring 0.165 mm thick. The resulting assembly was rolled to form an Al-Nb-Al clad plate having a thickness of 0.20 mm (the atomic ratio $Nb:Al \approx 3:1$).

The clad plate was then chopped into pieces of about 10×10 mm. 138 g of the pieces were packed into an 8-2 brass cylindrical container (40 mm in diameter) to make a billet for extrusion. The compacting was carried out using compacting loads of 25 t, 20 t, and 10 t, respectively, to prepare three different billets. The billets were subjected to extrusion using an extrusion ratio of 5 at maximum extrusion load of 185 t. Dense rods measuring 18 mm in diameter were obtained.

Figure 2:
FIGS. 2(a) and (b) are photographs showing the microstructure of a transverse cross section and a longitudinal cross section, respectively, of a dense rod obtained by cold extrusion in a working example of the present invention.
Figure 2:
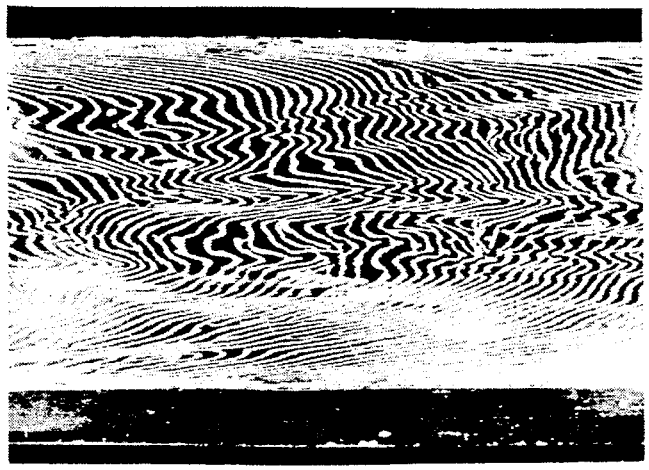

Transverse and longitudinal cross sections of the extruded rods were observed. Photomicrographs of the cross sections are shown in FIGS. 2(a) and 2(b), respectively.

The extruded rods were then rolled with grooved rolls and then drawing to reduce the rod diameter from 18 mm to 6.2 mm (including the sheath thickness). After removing the sheath of 8-2 brass, another sheath of S35C steel (steel containing 0.35% of carbon which has been subjected to a patenting treatment) was used to carry out drawing. The sheath had an initial outer diameter of 9.5 mm. This was reduced by drawing to 0.2 mm, while the rod diameter was decreased from 4.7 mm to 0.1 mm to form a wire.

Photomicrographs of the cross section of the resulting wires which were subjected to different degrees of working are shown in FIGS. 3(a)–3(c). The degree of working of the wires in FIGS. 3(a)–3(c) is the ratio of the initial cross sectional area to the cross sectional area after working. It is necessary to refine the structure in order to form the intended intermetallic compound of $Nb_3Al$ efficiently. It is said that the intermetallic compound of $Nb_3Al$ can be easily and efficiently formed when the Nb portion thereof is less than 1 μm in size.

After removing the sheath, a final product in the form of Nb-Al wire was obtained. It was then subjected to a variety of heat treatments to form a $Nb_3Al$ intermetallic compound. The heat treatment was carried out in two stages. The first stage was treatment at a high temperature for a short time, and the second stage was treatment at a low temperature for a long time. The purpose of the first stage was to react Nb with Al to form Nb$_3$Al of the short range A15 type compound. The second stage was carried out to achieve the ordering of the short range compound to form Nb$_3$Al of the long range A15 type compound, which has much improved superconducting properties.

Figure 4:
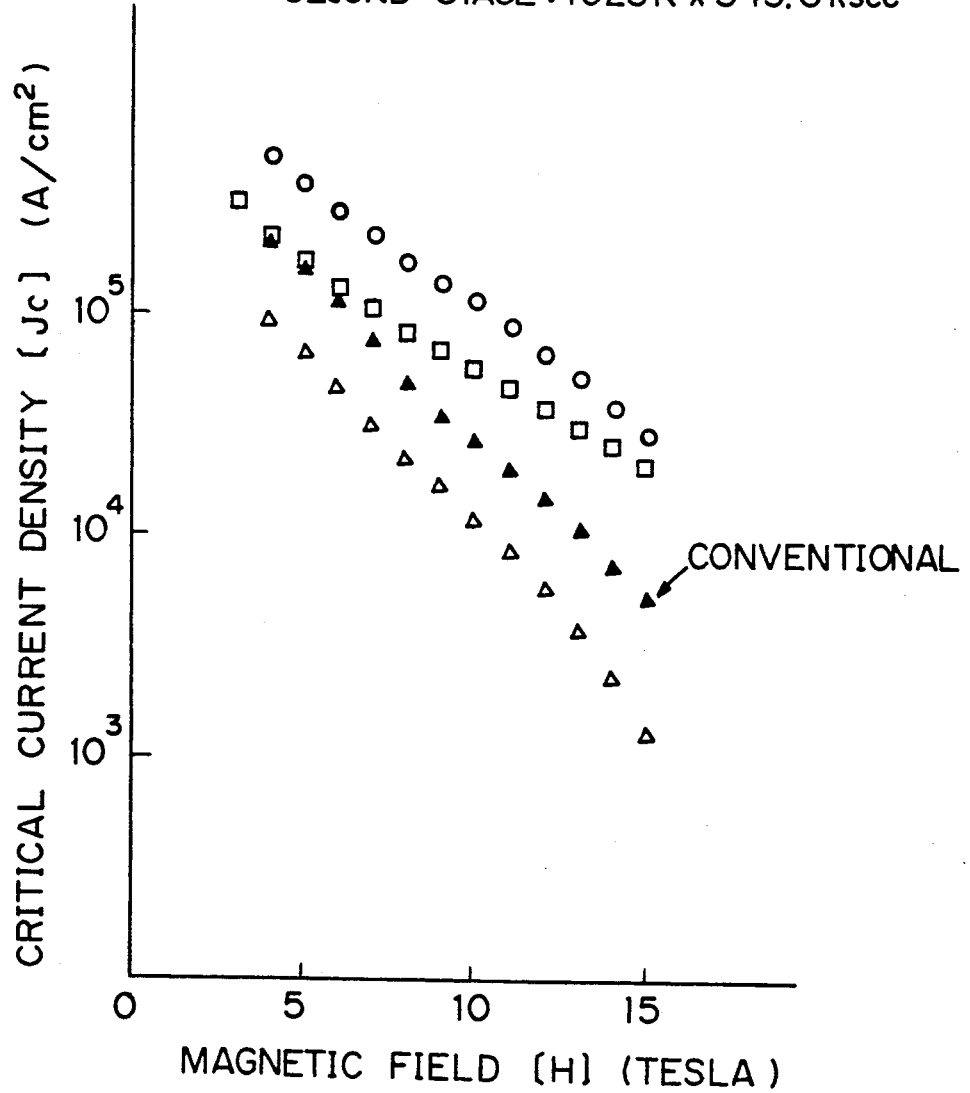
FIGS. 4–6 are graphs showing the critical current density (Jc) versus the applied magnetic field (B) for Nb$_3$Al wires obtained in a working example of the present invention.
Figure 5:
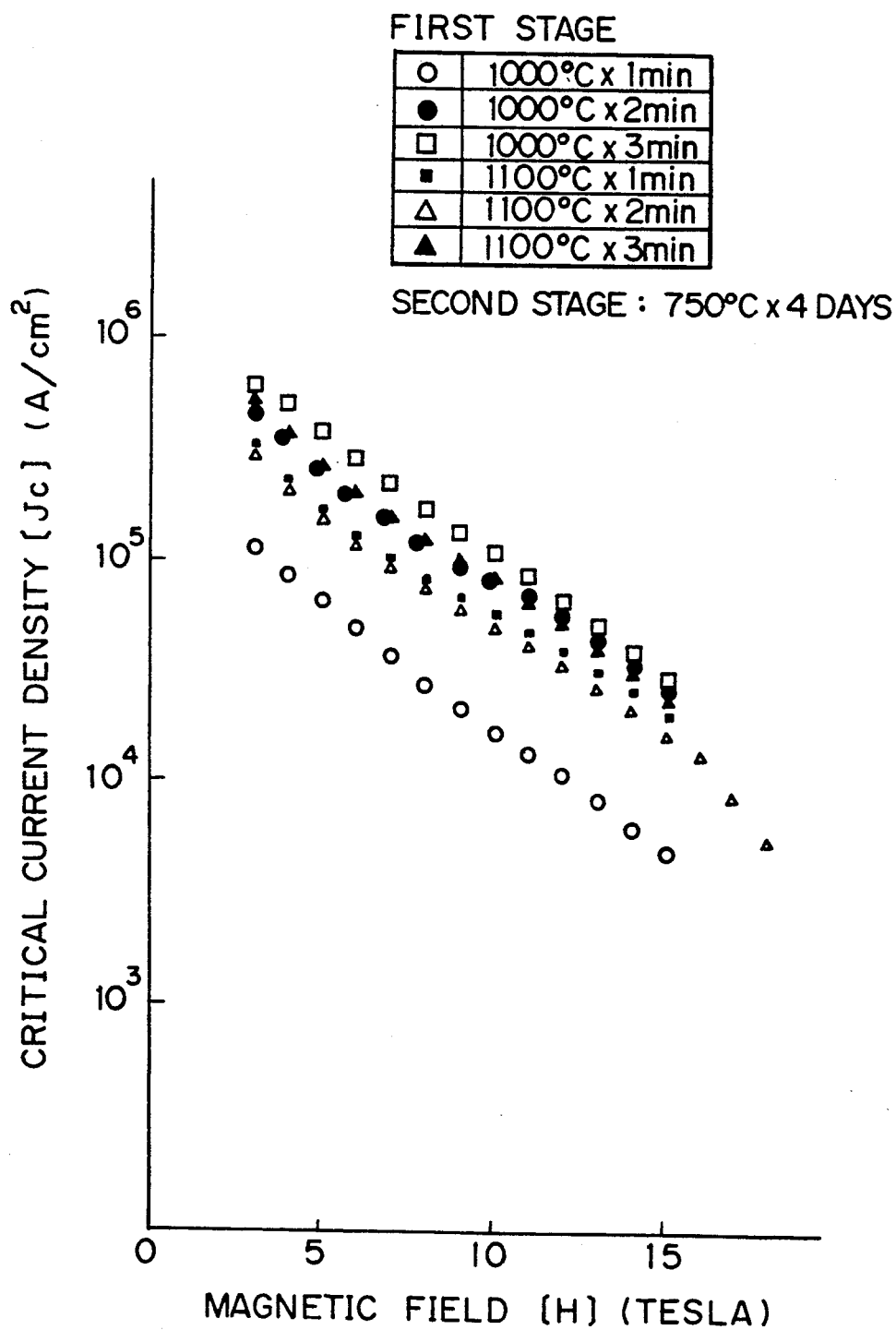
Figure 6:
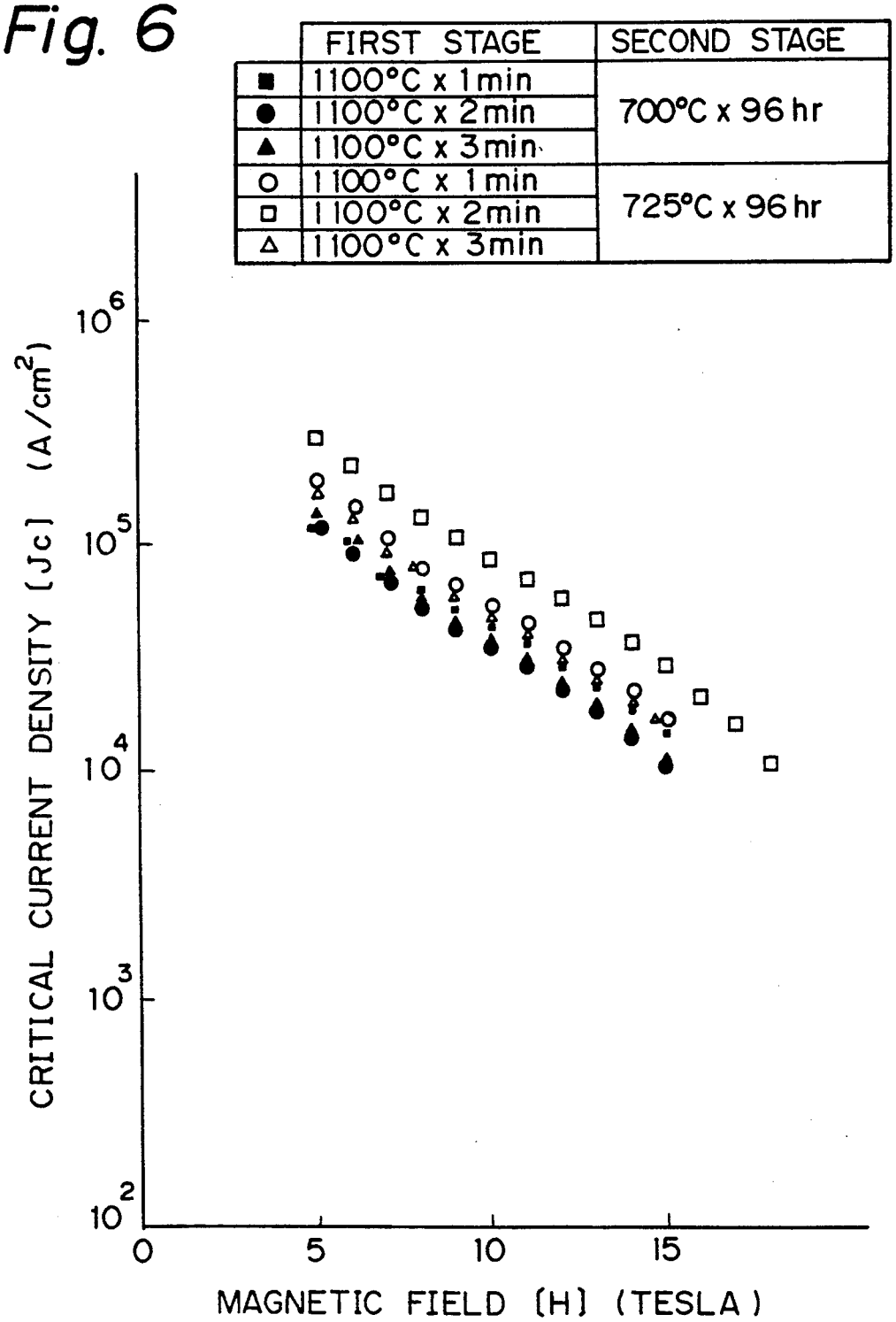
Figure 7:
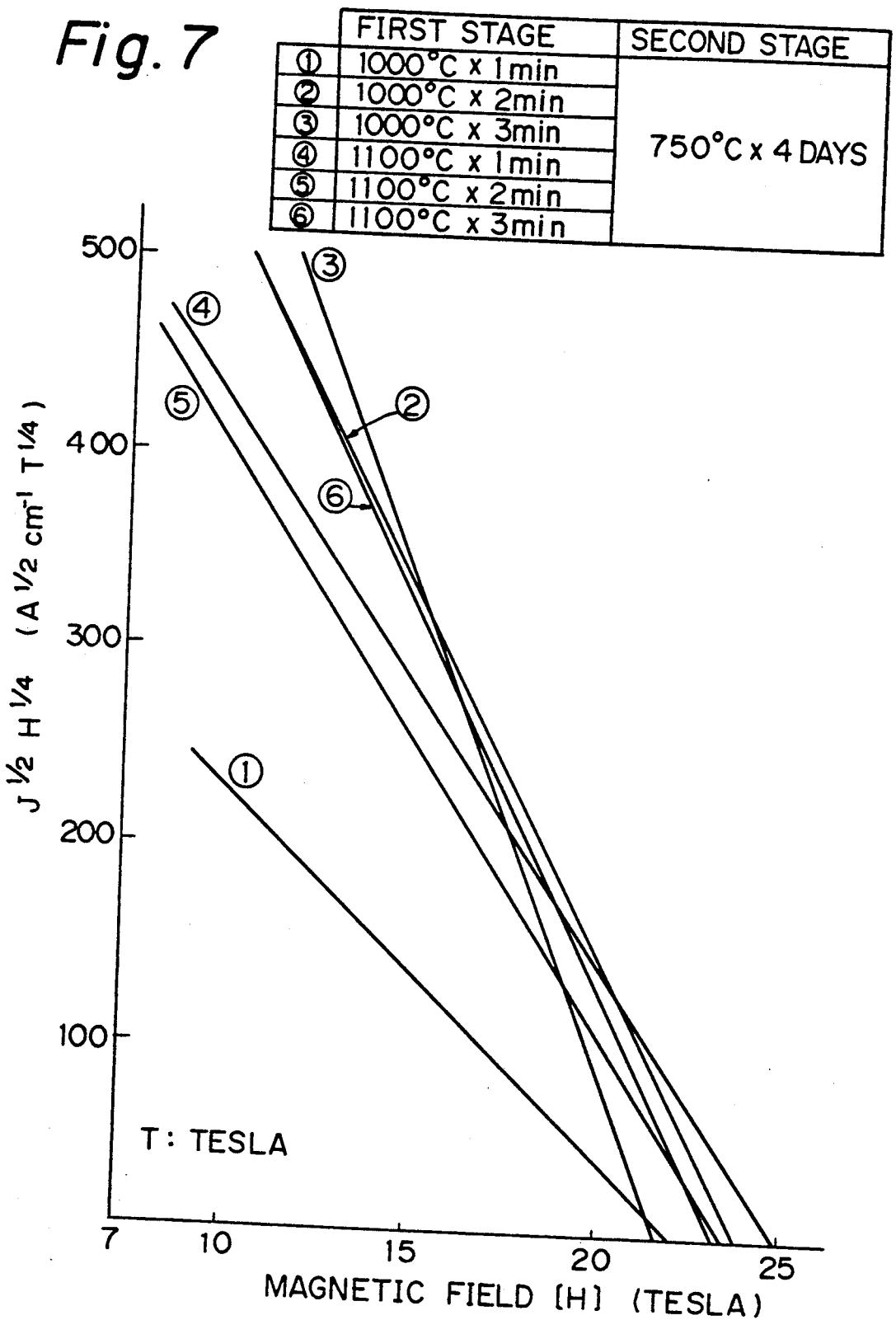
FIG. 7 is a graph showing the upper critical magnetic field (Hc$_2$) of a Nb$_3$Al wire obtained in a working example of the present invention.

Superconductivity was measured for the resulting intermetallic compound wires. The results are summarized in FIGS. 4–7. FIGS. 4–6 show the critical current density (Jc) and FIG. 7 shows the upper critical magnetic field (Hc$_2$) which was found using the Kramer. Plotting method.

Using the values shown in FIGS. 4–7, the properties of a typical Nb$_3$Al wire which was obtained by the process of the present invention can be described quantitatively as follows:

Thermal treatment carried out at 1000° C. for 1 minute and then at 750° C. for 4 days:
  Critical Temperature (Tc): 17K (−256° C.)
  Critical Current Density (Jc): $3 \times 10^4$ A/cm$^2$
  [External Magnetic Field 15 Tesla, at 4.2K]
  Upper Critical Magnetic Field (Hc$_2$): about 25 Tesla
  [Extrapolated Value of Kramer . Plotting]

These properties are comparable with those of Nb$_3$Al wire obtained by the conventional infiltration method shown by     in FIG. 4.

Thus, it is apparent that according to the present invention, it is possible continuously to produce an extremely fine wire of a hard-to-work material, i.e., Nb$_3$Al intermetallic compound in an easy and efficient manner on an industrial scale.

Example 2

In this example, NiTi wire was manufactured.

A Ti plate was sandwiched between two Ni plates to prepare a laminate assembly, and the assembly was rolled to form a Ni-Ti-Ni laminate with a thickness of 0.3 mm (atomic ratio of Ni:Ti=50:50).

From this laminate, discs (10 mm in diameter) were stamped out, and the remaining laminate with stamped holes was cut into pieces having random shapes. These shapes were packed into an 8-2 brass cylindrical container (40 mm in diameter). After packing, the compact was subjected to a pressure of 15 tons for 3 minutes to prepare a billet for extrusion. Cold extrusion was carried out using an extrusion ratio of 5 to obtain a dense rod measuring 18 mm in diameter.

Figure 8:
FIGS. 8(a) and (b) are photographs showing the microstructures of the cross section of the dense rod obtained from disk shaped pieces and randomly shaped pieces, respectively, in a working example of the present invention.
Figure 8:
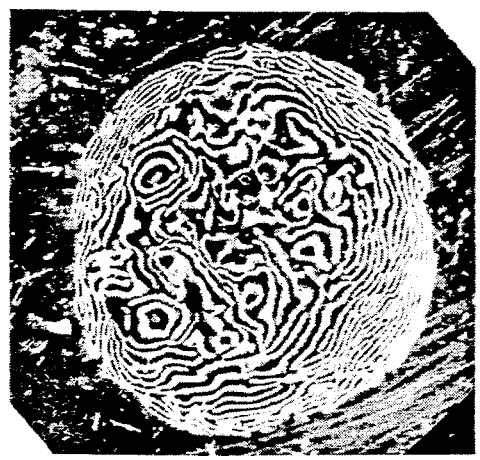
Figure 9:
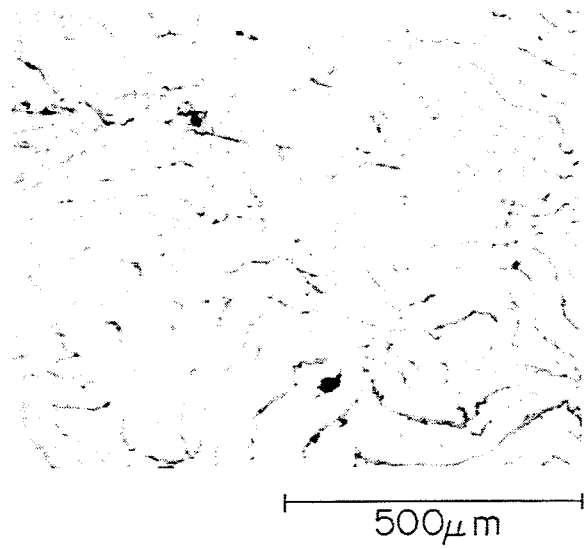
FIGS. 9(a) and 9(b) are photographs each showing the microstructure of dense rods subjected to different degrees of working which were obtained from randomly shaped pieces by cold extrusion, rolling, and drawing in a working example of the present invention.
Figure 9:
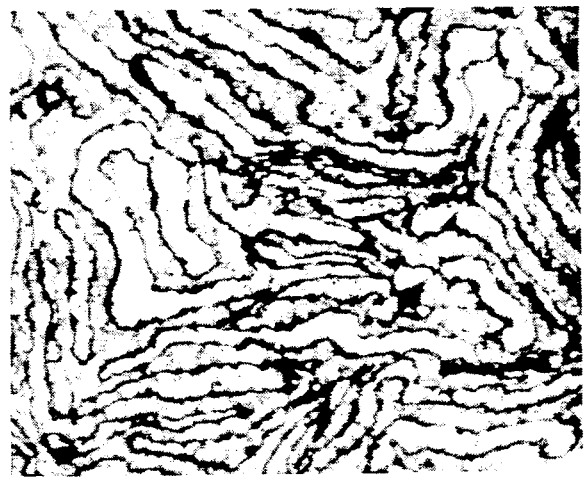
Figure 10:
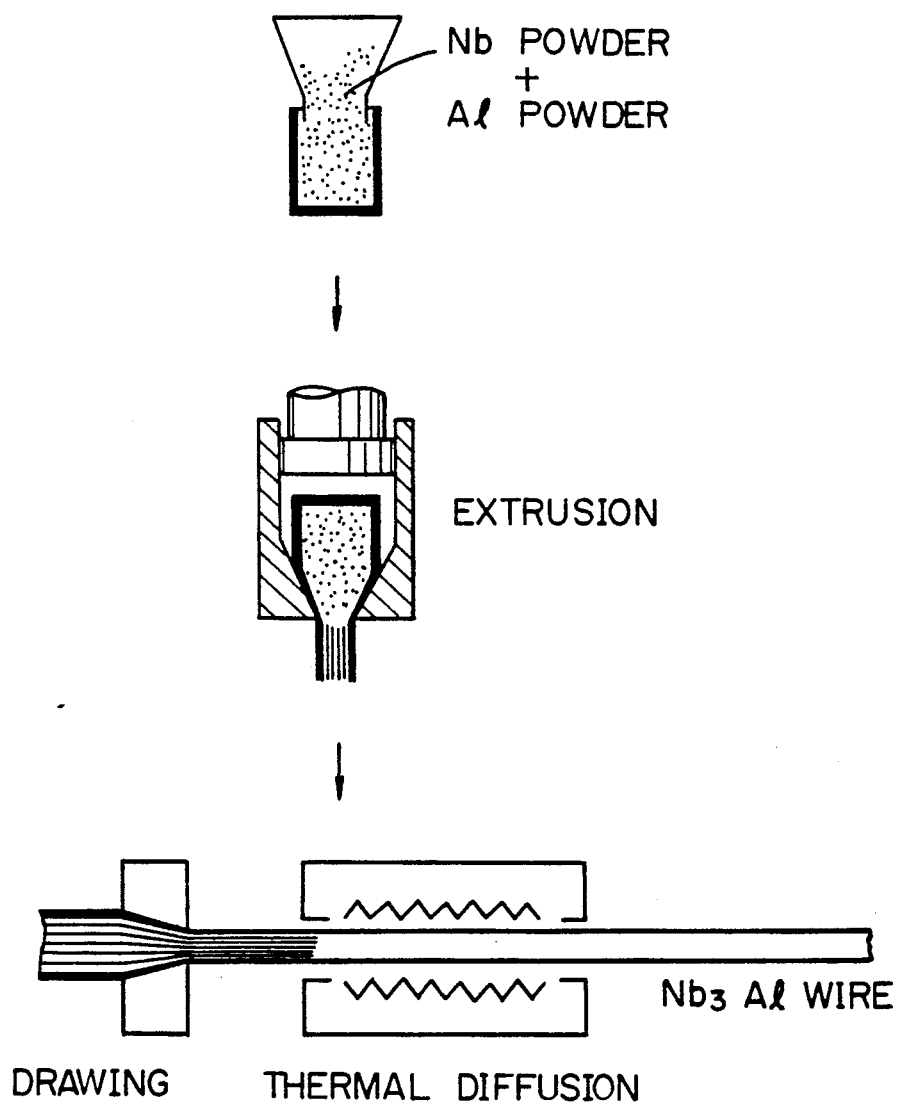
FIG. 10 is an illustration of a conventional powder metallurgy process.
Figure 11:
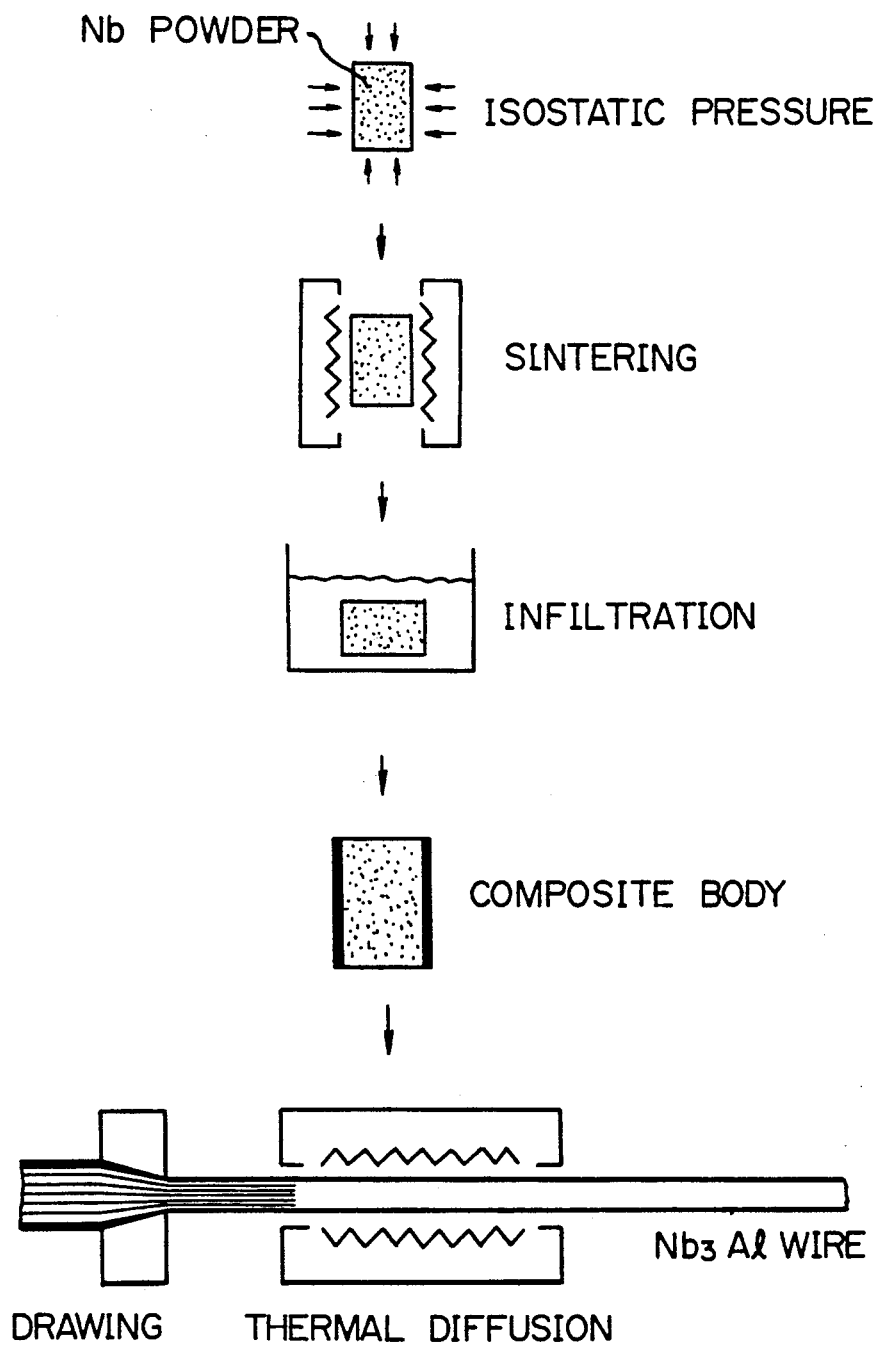
FIG. 11 is an illustration of a conventional infiltration method.
Figure 12:
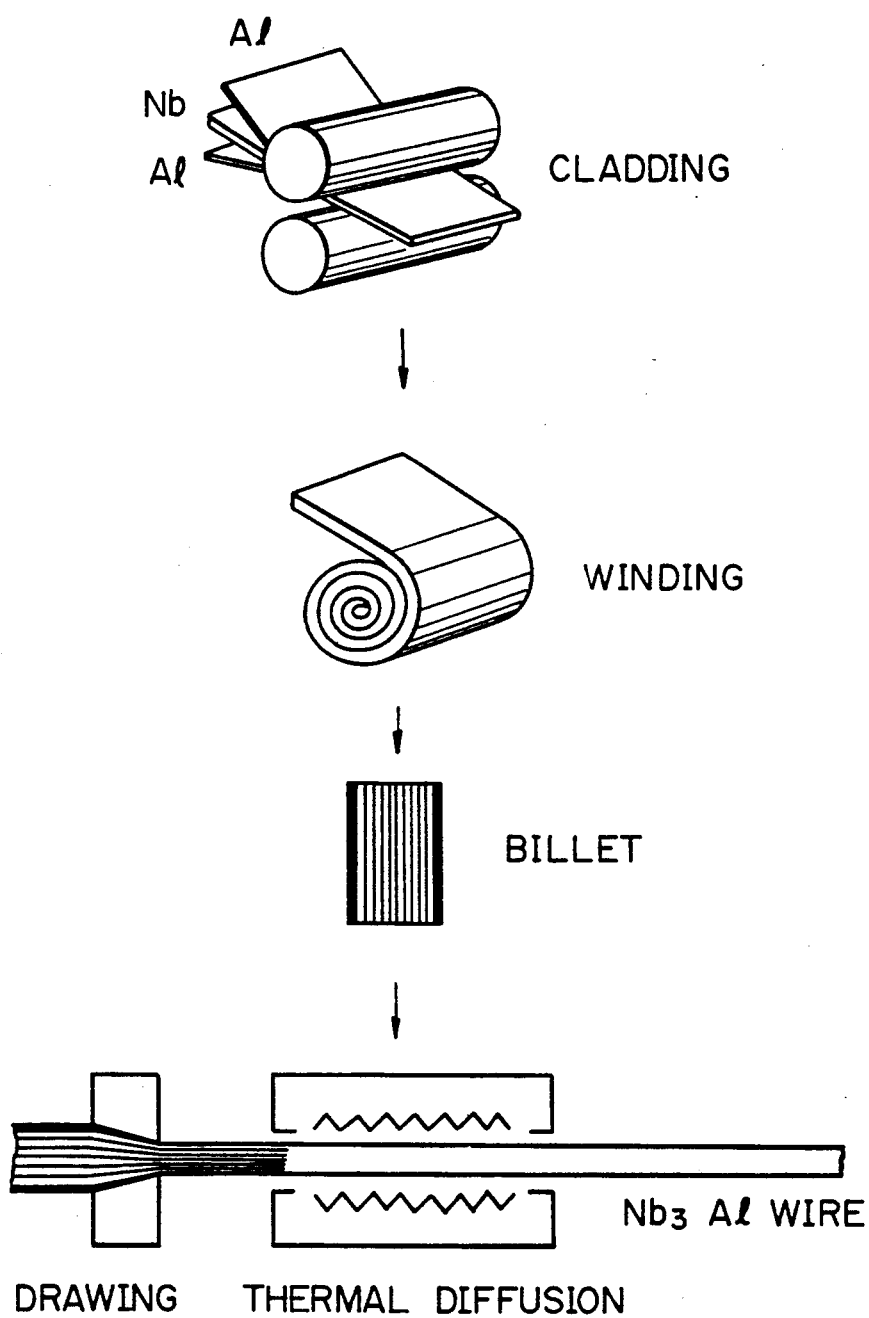
FIG. 12 is an illustration of a conventional jelly-roll method.
Figure 13:
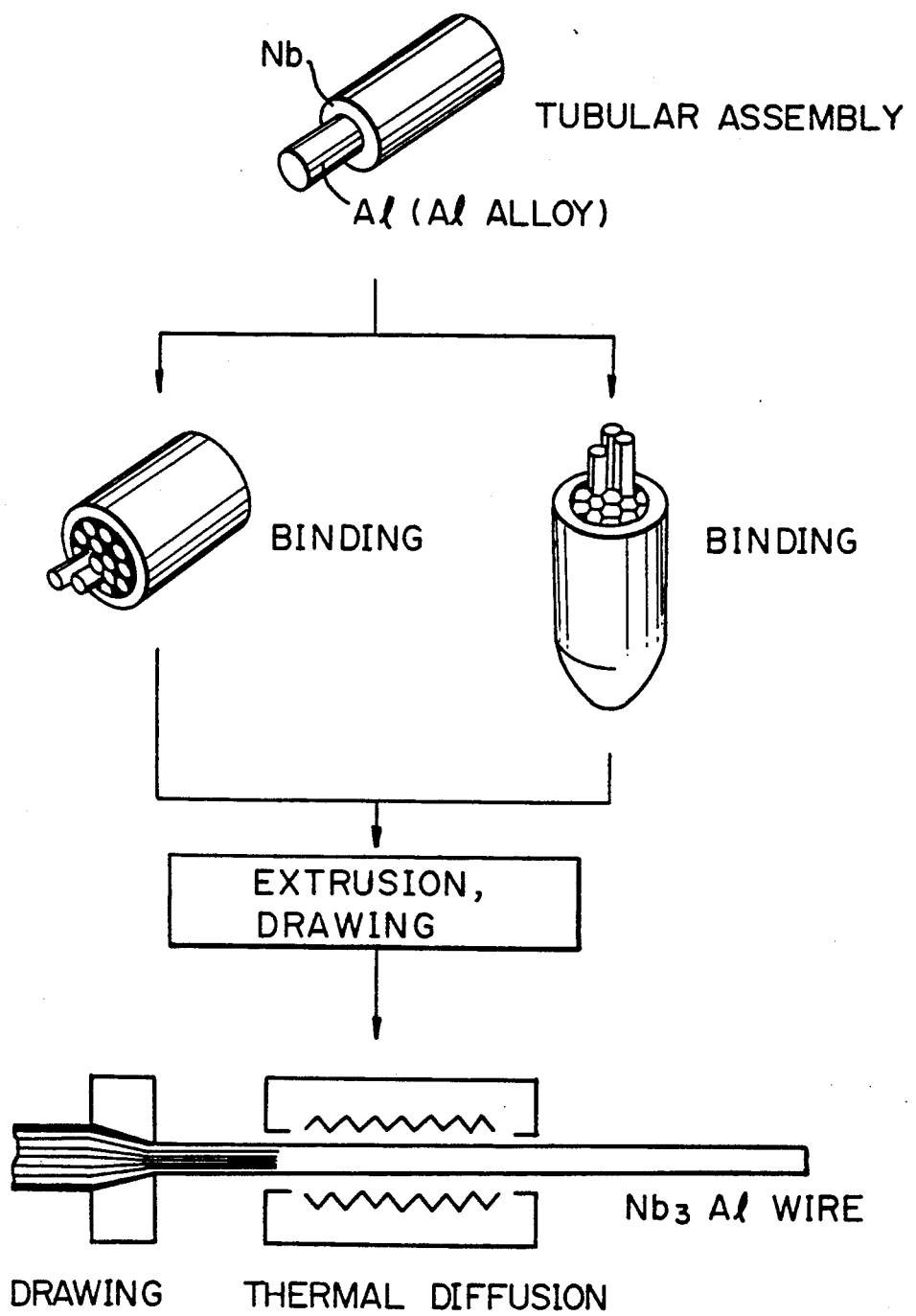
FIG. 13 is an illustration of a conventional tube process.

FIGS. 8(a) and 8(b) are photomicrographs of a cross section of the resulting dense rods. FIG. 8(a) shows a rod prepared from discs, and FIG. 8(b) shows a rod prepared from the pieces with random shapes. It is apparent from these figures that the structure depends on the shape of the pieces. From the pieces with random shapes, it is possible to form a shape memory alloy having a uniform structure having improved shape memory properties. When working is performed repeatedly, it is possible to make the structure more uniform. This is apparent from FIGS. 9(a) and 9(b) which show photomicrographs of cross sections of alloy rods which were manufactured from the randomly shaped pieces using two different working ratios. When the working ratio is high, it is possible to manufacture a uniform alloy.

The thus-obtained rods were then subjected to rolling with grooved rolls to form a wire measuring 3 mm in diameter. After annealing (450° C.×15 minutes), the sheath of 8-2 brass was removed, and the rod was inserted into another sheath of carbon steel having a diameter of 9.4 mm. The rod inside the sheath was then subjected to rolling with grooved rolls while drawing was performed to form a wire measuring 0.2 mm in diameter.

After the drawing, the sheath was removed using nitric acid. The remaining Ti-Ni wire was subjected in vacuum to a thermal diffusion treatment at 850° C. for 80 minutes to form a TiNi intermetallic compound, and it was then subjected in vacuum to a shape memory treatment at 400° C. for 40 minutes.

The shape memory properties of the resulting TiNi wire were measured. The shape memory properties of the alloy were satisfactory, and its shape memory temperature, i.e., transformation temperature was determined to be 65° C.

Thus, it is possible to manufacture an article made of hard-to-work materials, such as a TiNi intermetallic compound in an easy and efficient manner on an industrial scale.

Although the present invention has been described with preferred embodiments it is to be understood that variations and modifications may be employed without departing from the concept of the present invention as defined in the following claims.

What is claimed is:

1. A method for manufacturing a hard-to-work alloy article comprising the steps of:
   preparing a laminate member comprising a plurality of layers of different metals in a stoichiometric ratio for the intended alloy composition;
   dividing the laminate member into pieces;
   combining the pieces in a random arrangment to a body for plastic deformation;
   subjecting the body to plastic deformation under pressure to form an article having a given shape and dimensions; and
   applying a thermal diffusion treatment to the article.

2. A method as set forth in claim 1 wherein the laminate member is in the form of a plate.

3. A method as set forth in claim 1 wherein the laminate member is divided into pieces by cutting.

4. A method as set forth in claim 1 wherein the laminate member is divided into pieces by stamping.

5. A method as set forth in claim 1 wherein the pieces are rectangular, circular, elliptical, triangular, polygonal, or star-shaped.

6. A method as set forth in claim 1 wherein the plastic deformation is carried out by means of extrusion or rolling or drawing or a combination thereof.

7. A method as set forth in claim 1 wherein the thermal diffusion is carried out under conditions sufficient to form an intermetallic compound.

8. The method of claim 1, wherein the combining step includes charging the pieces into a container so as to provide the pieces in said random arrangement.

9. The method of claim 1, wherein the pieces have a maximum dimension of 50 mm.

10. The method of claim 1, wherein the pieces have identical shapes.

11. The method of claim 1, wherein the pieces have random shapes.

12. The method of claim 1, wherein the pieces are flat and have a uniform thickness.

13. The method of claim 1, wherein the combining step includes compacting the pieces in said random arrangement in a container.

14. The method of claim 1, wherein the combining step includes compacting the pieces in said random arrangement into a plurality of bodies and combining the bodies for deformation in the plastically deforming step.

15. A method as set forth in claim 2 wherein the laminate plate is prepared by rolling an assembly of a plurality of plates.

16. A method as set forth in claim 2 wherein the laminate plate comprises Al plate-Nb plate-Al plate with an atomic ratio of Nb:Al=3:1.

17. A method as set forth in claim 2 wherein the laminate plate comprises Ni plate-Ti plate-Ni plate with an atomic ratio of Ni:Ti=50:50.

18. A method of manufacturing a superconducting $Nb_3Al$ compound comprising the steps of:
   preparing a laminate member comprising a plurality of layers of Nb and Al, the Nb and Al being present in amounts in the laminate member which will provide a stoichiometric ratio of $Nb_3Al$;
   dividing the laminate member into a plurality of pieces;
   combining the pieces together in a random arrangement to form a body;
   plastically deforming the body to form a shaped article; and
   heat treating the shaped article at a temperature sufficient to cause diffusion of at least one of the Nb and Al and form an $Nb_3Al$ intermetallic compound.

19. The method of claim 18, wherein the heat treatment forms $Nb_3Al$ of a short range A15 type compound.

20. The method of claim 18, wherein the heat treatment forms $Nb_3Al$ of a long range A15 type compound.

21. The method of claim 18, wherein the laminate member includes Ge and the intermetallic compound is $Nb_3Al_xGe_{1-x}$, wherein x is less than 1.0.

22. The method of claim 18, wherein the combining step comprises compacting the pieces in a random arrangement in a container.

23. The method of claim 18, wherein the laminate comprises at least one sheet consisting essentially of Al and at least one sheet consisting essentially of Nb.

24. The method of claim 18, wherein the pieces have a maximum dimension of 50 mm.

25. The method of claim 18, wherein the pieces have identical shapes.

26. The method of claim 18, wherein the pieces have random shapes.

27. The method of claim 18, wherein the pieces have flat shapes selected from the group consisting of rectangular, circular, elliptical, triangular, polygonal, and star shapes.

28. The method of claim 18, wherein during the compacting step the pieces are compacted in the container, the container having diameter greater than a maximum dimension of the pieces.

29. The method of claim 18, wherein during the compacting step a plurality of bodies are formed and during the plastically deforming step the plurality of bodies are collected and plastically deformed.

* * * * *